June 1, 1965 D. A. GORSKI 3,186,874
PHOTOVOLTAIC CELL
Filed Sept. 21, 1961
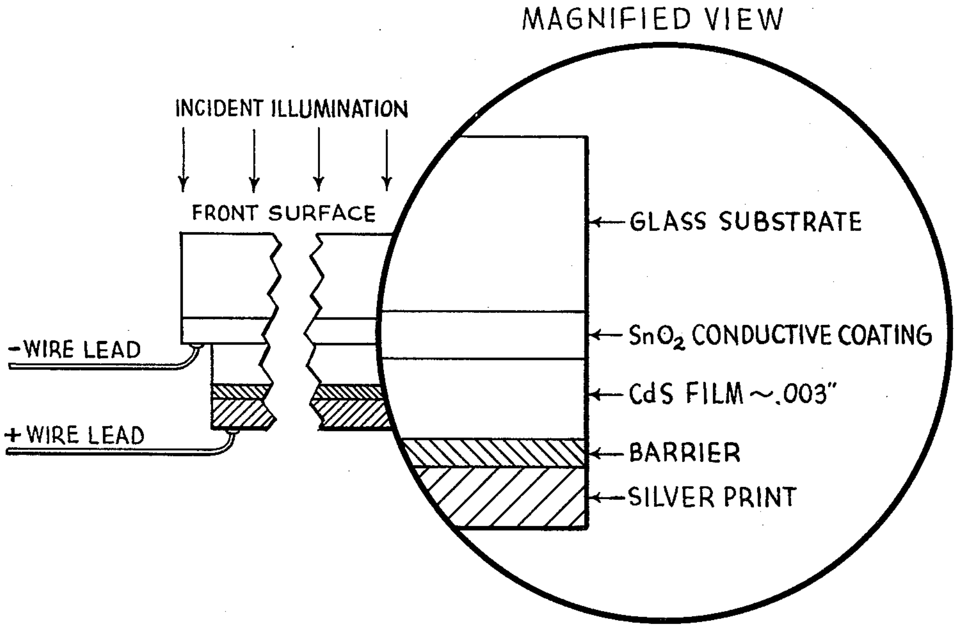
Daniel A. Gorski INVENTOR.
BY
William H Brown

United States Patent Office 3,186,874
Patented June 1, 1965

3,186,874
PHOTOVOLTAIC CELL

Daniel A. Gorski, Middleburg Heights, Ohio, assignor to The Harshaw Chemical Company, Cleveland, Ohio, a corporation of Ohio Filed Sept. 21, 1961, Ser. No. 139,781
7 Claims. (Cl. 136—89)

This invention relates to new and improved cadmium sulfide photovoltaic cells and more specifically to cadmium sulfide polycrystalline photovoltaic cells of increased efficiency.

Cadmium sulfide photovoltaic cells with which the present invention is concerned are devices wherein a barrier layer and photoactive centers are formed at a surface of an evaporated layer of N-type polycrystalline cadmium sulfide.

Cadmium sulfide polycrystalline photovoltaic cells are known; cells of this type being described in Carlson U.S. Patent No. 2,820,841, which suggests that the preferred type of photovoltaic cell is one wherein the cadmium sulfide layer is from 0.2 to 10 microns thick. Cells having the thickness of the Carlson cell have been found to have efficiencies of solar energy conversion of no greater than about 0.1%.

It is, accordingly, the general object of this invention to provide cadmium sulfide polycrystalline photovoltaic cells of solar energy conversion efficiencies greater than 0.1%.

More specifically, it is an object of this invention to provide cadmium sulfide, polycrystalline film, photovoltaic cells having cadmium sulfide layers in excess of 20 microns thickness, preferably having its crystals mostly fiber axis oriented to the substrate and of a thickness in excess of 20 microns.

It is still another object of this invention to provide means for the deposition of better adhering cadmium sulfide films in the preparation of cadmium sulfide polycrystalline photovoltaic cells.

It has now been discovered that the cadmium sulfide, polycrystalline, photovoltaic cell having solar conversion efficiencies of up to 3.5% may be obtained by the utilization of a cadmium sulfide film having a thickness from 20 to 100 microns by introducing photoactive centers in the CdS surface and by forming a rectifying barrier contact with said surface. The reason for making the film 20 to 100 microns thick is that in subsequent processing when the cell is heated, the barrier forming material has a tendency to diffuse rapidly along the grain boundaries and, therefore, to create an electrical low resistance path through the thickness of the cell.

In the cells produced according to the invention, cadmium sulfide polycrystalline, photovoltaic cells result wherein photoactive centers are present as part of the CdS crystalline surface structure, and their energies are in the forbidden energy gap of CdS. A compound having a work function greater than that of the CdS surface is formed on this surface and provides a rectifying junction of this material with the N-type CdS bulk in the dark. Under exposure to solar energy only the light of wavelength greater than 0.52 micron, which is the absorption edge of CdS, passes first through the CdS layer and is absorbed by the photovoltaic layer physically contained within the electrostatic surface charge of the rectifying contact, causing the CdS photoactive surface to become highly photoconductive, in that there is a suppression of the barrier height with respect to flow of current to the external circuit through ohmic contacting electrodes.

The photovoltaic cells comprising cadmium sulfide films in the desired thicknesses may be obtained by vapor deposition of cadmium sulfide. As a source of cadmium sulfide, cadmium sulfide crystal chips may be used. These chips may be undoped or doped with $InCl_3$, $GaCl_3$, $BCl_3$, or Cd excesses. Films of CdS are preferably formed by vapor deposition on a rigid frosted glass substrate which has been coated with tin oxide. The glass substrate preferably is maintained at temperatures from 75° C. to 350° C. during vapor deposition. The frosting of the glass causes irregularities of the glass surface which affect not only the glass but also the surface of the tin oxide opposite the glass and thus improves the adherence between the tin oxide layer and the CdS layer.

The barrier layer may be formed on the polycrystalline layer by electroplating a copper layer on said polycrystalline layer at high current density in a copper plating solution, and then subjecting the resulting coating to heat treatment in air for 1–30 seconds at 275° C. While the electroplating solutions employed in the electrodeposition operation of this invention may be distinctly acidic plating solutions, or distinctly basic plating solutions, the acidic solutions are preferred. The barrier may be formed by other methods.

The figure is a schematic cross sectional elevation of a cadmium sulfide polycrystalline photovoltaic cell according to this invention.

Referring now to the drawing, initial deposition on the glass substrate is a conductive coating which may be antimony doped tin oxide. The second deposit is a cadmium sulfide film from 20 to 100 microns thick. Photoactive centers are formed on the cadmium sulfide film surface, resulting in a barrier, preferably by electrodeposition as indicated above. An ohmic contact is then made with the barrier forming layer, preferably by applying an intimately associated silver coating on portions of the surface. The silver may be applied in the form of a suspension of silver particles in a hardening organic vehicle in solution in a volatile solvent. When wire leads are contacted with the tin oxide transparent conductive coating and the silver coating, a complete cell is formed through which current will flow when solar energy passes through the glass substrate and the cadmium sulfide to be converted at the barrier of the cell to electrical energy. It will be understood that the figure shows as the top layer the glass substrate because it is, in the use of the device the layer which the light first strikes. The figure stands as it does because it is convenient to emphasize the direction from which the light comes. It will be noted that in the cell shown, the light will pass first through the cadmium sulfide before reaching the photovoltaic barrier. It is, for this reason, called a backwall cell. As such it converts to electrical energy part of the incident light having wavelength greater than 0.52 micron.

What is claimed is:

1. In a photovoltaic cell comprising a layer of N-type, polycrystalline cadmium sulfide disposed on a substrate, having opposite surfaces defining planes substantially parallel to each other, a photovoltaic barrier layer forming an integral part of one of said surfaces and electrodes electrically attached to each of said surfaces the improvement wherein said cadmium sulfide layer has a thickness of from 20 to 100 microns and having a substantial portion of its crystals axis-oriented with respect to said substrate.

2. A photovoltaic cell comprising a layer of N-type, polycrystalline cadmium sulfide disposed on a substrate, on one surface of which a photovoltaic barrier layer is provided in intimate contact therewith, a metallic conducting layer in contact with said barrier and a transparent conductive coating in contact with the opposite surface of said cadmium sulfide layer, said layer of cadmium sulfide being of a thickness from 20 to 100 microns and having a substantial portion of its crystals axis-oriented with respect to said substrate.

3. The photovoltaic cell according to claim 2 wherein said transparent conductive layer is a deposited coating of a conductive material.

4. The photovoltaic cell according to claim 2 wherein said transparent conductive coating is antimony doped tin oxide.

5. The photovoltaic cell of claim 2 wherein the N-type, polycrystalline cadmium sulfide layer has a resistivity of 0.1 to 10 ohm cm.

6. The photovaltaic cell of claim 2 wherein the metallic conducting layer in contact with the photovoltaic barrier layer is a silver composition.

7. The photovoltaic cell according to claim 3 wherein said transparent conductive coating is antimony doped tin oxide.

References Cited by the Examiner

UNITED STATES PATENTS

| | | | |
|---|---|---|---|
| 2,688,564 | 9/54 | Forgue | 136—89 |
| 2,820,841 | 1/58 | Carlson et al. | 136—89 |

WINSTON A. DOUGLAS, *Primary Examiner.*

JOSEPH REBOLD, *Examiner.*